(12) United States Patent
Nabatame et al.

(10) Patent No.: US 7,202,539 B2
(45) Date of Patent: Apr. 10, 2007

(54) SEMICONDUCTOR DEVICE HAVING MISFET GATE ELECTRODES WITH AND WITHOUT GE OR IMPURITY AND MANUFACTURING METHOD THEREOF

(75) Inventors: Toshihide Nabatame, Tsukuba (JP); Masaru Kadoshima, Tsukuba (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/132,373

(22) Filed: May 19, 2005

(65) Prior Publication Data

US 2005/0280095 A1   Dec. 22, 2005

(30) Foreign Application Priority Data

Jun. 16, 2004   (JP) .............................. 2004-178164

(51) Int. Cl.
   *H01L 29/76* (2006.01)
(52) U.S. Cl. ................. 257/407; 257/E21.425
(58) Field of Classification Search ................ 257/407, 257/E21.425; 438/285
   See application file for complete search history.

(56) References Cited

U.S. PATENT DOCUMENTS 6,599,831 B1   7/2003   Maszara et al. ............ 438/649

2001/0023116 A1*   9/2001   Wurzer et al. .............. 438/528
2002/0130393 A1*   9/2002   Takayanagi et al. ........ 257/616
2003/0203609 A1   10/2003   Maszara et al. ............ 438/592

FOREIGN PATENT DOCUMENTS

| JP | 2000-252462 | 3/1999 |
| JP | 2002-319670 | 4/2001 |
| JP | 2003-347425 | 4/2003 |
| JP | 2005-191545 | 11/2004 |

OTHER PUBLICATIONS

Office Action from the Japanese Patent Office dated Apr. 18, 2006 (in Japanese).

* cited by examiner

*Primary Examiner*—Thomas L. Dickey
(74) *Attorney, Agent, or Firm*—Reed Smith LLP; Stanley P. Fisher, Esq.; Juan Carlos A. Marquez, Esq.

(57) ABSTRACT

The performance and reliability of a semiconductor device are improved. In a semiconductor device having a CMISFET, a gate electrode of an n channel MISFET is composed of a nickel silicide film formed by reacting a silicon film doped with P, As, or Sb with an Ni film, and a gate electrode of a p channel MISFET is composed of a nickel-silicon-germanium film formed by reacting a nondope silicon germanium film with the Ni film. The work function of the gate electrode of the n channel MISFET is controlled by doping P, As, or Sb, and the work function of the gate electrode of the p channel MISFET is controlled by adjusting the Ge concentration.

2 Claims, 6 Drawing Sheets

SEMICONDUCTOR DEVICE HAVING MISFET GATE ELECTRODES WITH AND WITHOUT GE OR IMPURITY AND MANUFACTURING METHOD THEREOF

CROSS-REFERENCE TO RELATED APPLICATION

The present application claims priority from Japanese Patent Application JP 2004-178164 filed on Jun. 16, 2004, the content of which is hereby incorporated by reference into this application.

TECHNICAL FIELD OF THE INVENTION

The present invention relates to a semiconductor device and a manufacturing method thereof. More particularly, the present invention relates to a technology effectively applied to a semiconductor device provided with MISFETs each having a metal gate electrode and a manufacturing method thereof.

BACKGROUND OF THE INVENTION

After forming a gate insulating film on a semiconductor substrate and forming a gate electrode on the gate insulating film, source and drain regions are formed by the ion implantation or the like. Through the process described above, a MISFET (Metal Insulator Semiconductor Field Effect Transistor, MIS field effect transistor, MIS transistor) is formed.

Also, in the CMISFET (Complementary Metal Insulator Semiconductor Field Effect Transistor), in order to realize the low threshold voltage in both of the n channel MISFET and the p channel MISFET, the so-called dual-gate structure in which materials having different work functions (Fermi level, in the case of polysilicon) are used to form the gate electrodes has been employed. More specifically, an n type impurity and a p type impurity are introduced into the respective polysilicon films of the n channel MISFET and the p channel MISFET so that the work function (Fermi level) of the gate electrode material of the n channel MISFET becomes close to the conduction band of silicon and the work function (Fermi level) of the gate electrode material of the p channel MISFET becomes close to the valence band of silicon. By doing so, the threshold voltage is reduced.

However, the thickness of a gate insulating film has been reduced more and more due to the scaling down of the CMISFET device in recent years, and the influence of the depletion in the gate electrode when a polysilicon film is used for the gate electrode has become a significant problem. For the solution of the problem, there is the technology of using a metal gate electrode as the gate electrode for preventing the depletion in the gate electrode.

U.S. Pat. No. 6,599,831 B1 describes the technology in which a polysilicon film doped with a dopant is reacted with a nickel layer formed thereon to form a gate electrode made of nickel silicide.

SUMMARY OF THE INVENTION

As a result of the examination by the inventors of the present invention, the following problems are found out.

In the case where a polysilicon film is used as a gate electrode of a MISFET, influence of the depletion in the gate electrode made of polysilicon occurs in many cases. However, when a metal material such as nickel silicide is used to form the gate electrode, the depletion in the gate electrode can be suppressed and the parasitic capacitance can be removed. Consequently, the scaling down of the MISFET device (thickness reduction of gate insulating film) can be achieved.

However, even in the case where a metal film such as nickel silicide is used as the gate electrode material, the reduction of the threshold voltage in both of the n channel MISFET and the p channel MISFET of the CMISFET is desired for the improvement of the performance of the semiconductor device. For its achievement, it is necessary to control the work function of the gate electrodes of the n channel MISFET and the p channel MISFET.

In the technology in which a polysilicon film doped with a dopant is reacted with a nickel layer formed thereon to form a gate electrode made of nickel silicide, the work function of the gate electrode can be controlled by the dopant. However, the variation range of the work function of the gate electrode in the p channel MISFET is smaller than that of the work function of the gate electrode in the n channel MISFET. Also, in the thermal treatment, for example, the annealing for activating an impurity, boron (B) doped into a polysilicon film for forming a gate electrode of the p channel MISFET penetrates through the gate insulating film and diffuses into a channel region below the gate insulating film, and as a result, the characteristics and the reliability of the formed CMISFET may be influenced.

An object of the present invention is to provide a technology capable of improving the performance of a semiconductor device.

Another object of the present invention is to provide a technology capable of improving the reliability of a semiconductor device.

The above and other objects and novel characteristics of the present invention will be apparent from the description and the accompanying drawings of this specification.

The typical ones of the inventions disclosed in this application will be briefly described as follows.

The present invention provides a semiconductor device, which comprises: an n channel first MISFET; and a p channel second MISFET, wherein a first gate electrode of the first MISFET is composed of a first conductive film (metal film, metal compound film) made of at least one of Si and Ge and Ni, a second gate electrode of the second MISFET is composed of a second conductive film (metal film, metal compound film) made of at least one of Si and Ge and Ni, and Ge concentration of the second conductive film constituting the second gate electrode of the second MISFET is higher than that of the first conductive film constituting the first gate electrode of the first MISFET.

Also, the present invention provides a manufacturing method of a semiconductor device having an n channel first MISFET and a p channel second MISFET, which comprises the steps of: (a) preparing a semiconductor substrate; (b) forming a first insulating film for a gate insulating film on the semiconductor substrate; (c) forming a first dummy electrode of the first MISFET composed of a patterned silicon film on the first insulating film, and forming a second dummy electrode of the second MISFET composed of a patterned silicon germanium film on the first insulating film; (d) forming a metal film mainly made of nickel on the first dummy electrode and the second dummy electrode; and (e) forming a first gate electrode of the first MISFET made of nickel silicide by reacting the silicon film constituting the first dummy electrode with the metal film, and forming a second gate electrode of the second MISFET made of $Ni\,Si_{1-x}Ge_x$ by reacting the silicon germanium film constituting the second dummy electrode with the metal film.

The effect obtained by the representative one of the inventions disclosed in this application will be briefly described as follows.

That is, it is possible to improve the performance of a semiconductor device.

Also, it is possible to improve the reliability of a semiconductor device.

BRIEF DESCRIPTIONS OF THE DRAWINGS

DESCRIPTIONS OF THE PREFERRED EMBODIMENTS

Figure 1:
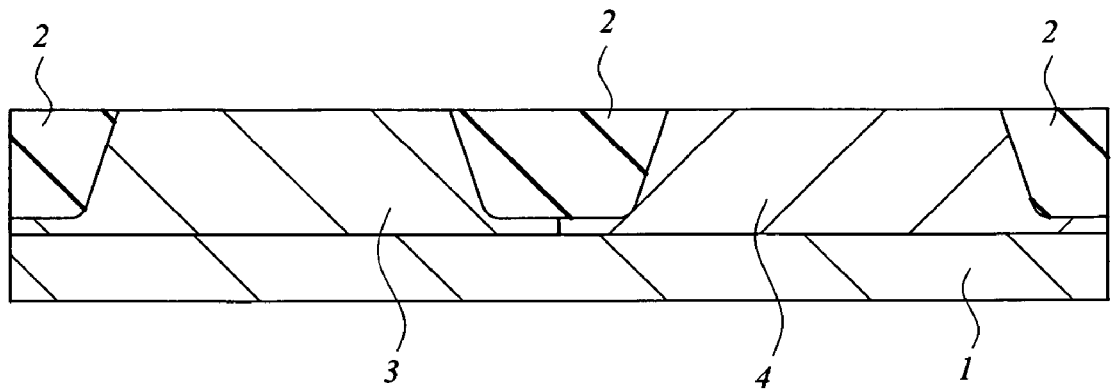
FIG. 1 is a cross-sectional view showing the principal part in the manufacturing process of a semiconductor device according to an embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, the description of the same and similar part is not repeated in principle unless particularly required in the following embodiments.

Also, in the drawings used in the embodiments, the hatching is omitted in some cases even in a cross-sectional view and the hatching is used in some cases even in a plan view so as to make the drawings easy to see.

First Embodiment

A semiconductor device and a manufacturing method thereof according to this embodiment will be described with reference to the drawings. FIGS. 1 to 11 are cross-sectional views showing the principal part in the manufacturing process of a semiconductor device according to an embodiment of the present invention, for example, a CMISFET (Complementary Metal Insulator Field Effect Transistor).

As shown in FIG. 1, a semiconductor substrate (semiconductor wafer) 1 made of p type single crystal silicon with a specific resistance of about 1 to 10 Ωcm is prepared, and device isolation regions 2 are formed in the main surface of the semiconductor substrate 1. The device isolation region 2 is composed of an insulator such as silicon oxide and is formed by, for example, the STI (Shallow Trench Isolation) method or the LOCOS (Local Oxidation of Silicon) method.

Next, a p type well 3 is formed in a region of the semiconductor substrate 1 in which the n channel MISFET is to be formed, and an n type well 4 is formed in a region of the semiconductor substrate 1 in which the p channel MISFET is to be formed. The p type well 3 is formed by the ion implantation of a p type impurity such as boron (B), and the n type well 4 is formed by the ion implantation of an n type impurity such as phosphorus (P) or arsenic (As).

Figure 2:
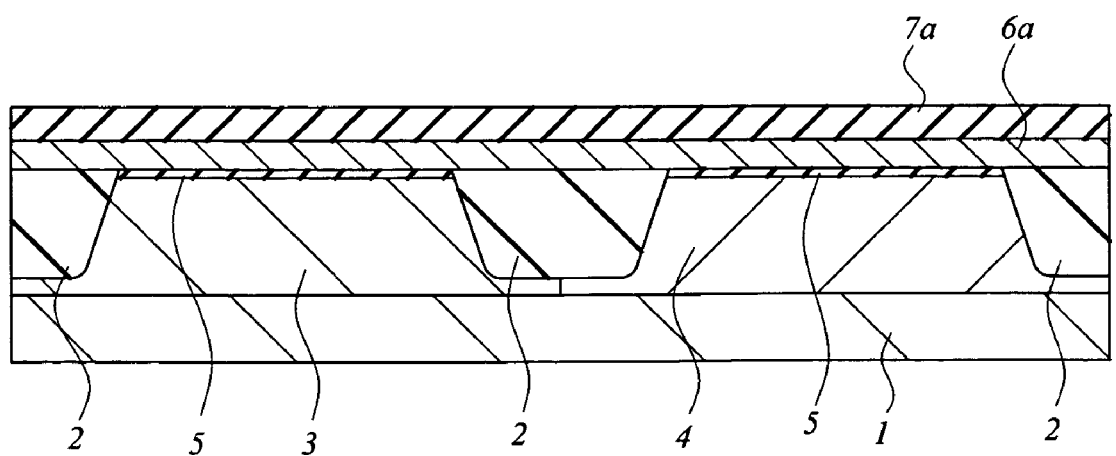
FIG. 2 is a cross-sectional view showing the principal part in the manufacturing process of a semiconductor device subsequent to FIG. 1.

Next, as shown in FIG. 2, a gate insulating film 5 is formed on surfaces of the p type well 3 and the n type well 4. The gate insulating film 5 is composed of, for example, a thin silicon oxide film and can be formed by, for example, the thermal oxidation method. When a silicon oxide film is used as the gate insulating film 5, the thickness thereof can be, for example, about 2 to 4 nm. In addition, it is also possible to use a silicon oxynitride film as the gate insulating film 5. Furthermore, it is also possible to use the so-called High-k (high dielectric constant) film made of, for example, hafnium oxide ($HfO_2$), hafnium aluminate ($HfAlO_x$), hafnium silicate ($HfSiO_x$), zirconia (zirconium oxide), zirconium aluminate ($ZrAlO_x$), zirconium silicate ($ZrSiO_x$), lanthanum oxide ($La_2O_3$), or lanthanum silicate ($LaSiO_x$). In this case, the structure in which a High-k film containing SiON which is hardly reacted with a silicon film is formed on the outermost layer is also available.

Next, a silicon film 6a is formed on the gate insulating film 5. The silicon film 6a is, for example, a polycrystalline silicon film and can be formed by the CVD (Chemical Vapor Deposition) method. When the CVD method is used as the method of forming the silicon film 6a, the silicon film 6a can be formed without damaging the gate insulating film 5 and the like. The thickness of the silicon film 6a can be, for example, about 50 nm. Also, an amorphous silicon film can be used as the silicon film 6a. After forming the silicon film 6a, an impurity (dopant) functioning as an n type impurity to the silicon film such as phosphorus (P), antimony (Sb) or arsenic (As) is introduced (doped) into the silicon film 6a by the ion implantation. Therefore, the silicon film 6a is a silicon film doped with an impurity (doped polysilicon film or doped amorphous silicon film).

Next, an insulating film (hard mask layer) 7a made of silicon oxide is formed on the silicon film 6a. The thickness of the insulating film 7a can be, for example, about 50 to 100 nm.

Figure 3:
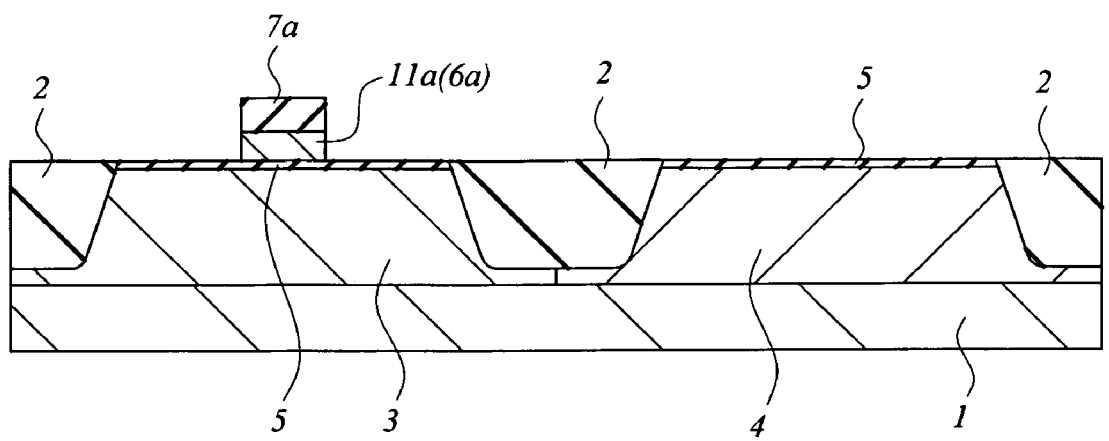
FIG. 3 is a cross-sectional view showing the principal part in the manufacturing process of a semiconductor device subsequent to FIG. 2.

Next, as shown in FIG. 3, a laminated film composed of the silicon film 6a and the insulating film 7a is formed through the patterning process (patterning, processing, selective removal) using the photolithography method and the dry etching method. For example, the reactive ion etching (RIE) is used in this patterning process. The patterned silicon film 6a forms a dummy gate electrode (dummy electrode) 11a on the p type well 3 via the gate insulating film 5. More specifically, the dummy gate electrode 11a for the n channel MISFET is composed of the silicon film 6a on the gate insulating film 5 of the p type well 3. This gate electrode 11a is to be a metal gate electrode (gate electrode 31a) of the n channel MISFET through the reaction process with a metal film 25 described later.

Figure 4:
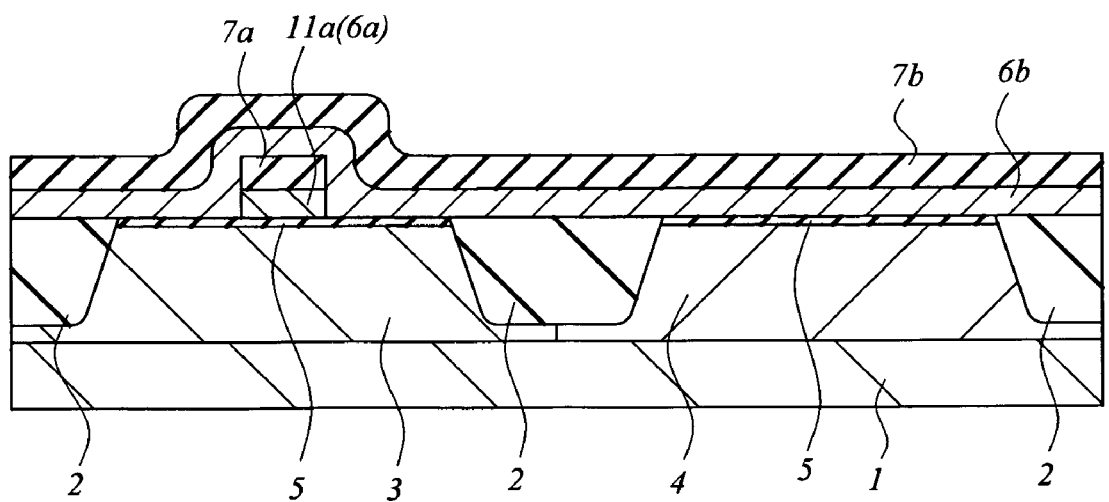
FIG. 4 is a cross-sectional view showing the principal part in the manufacturing process of a semiconductor device subsequent to FIG. 3.

Next, as shown in FIG. 4, a silicon germanium (SiGe) film 6b is formed on the semiconductor substrate 1 including on the gate insulating film 5 on the surface of the n type well 4. In the case where the gate insulating film 5 on the surface of the n type well 4 is damaged in the patterning process (dry etching process) of the silicon film 6a and the insulating film 7a, it is preferable to form the gate insulating film 5 again on the surface of the n type well 4 before forming the silicon germanium film 6b.

The silicon germanium film 6b can be formed by, for example, the CVD method. In this CVD method, for example, monosilane ($SiH_4$) gas and monogermane ($GeH_4$) gas diluted by $H_2$ are used to form the silicon germanium film 6b. When the CVD method is used as the method of forming the silicon germanium film 6b, the silicon germanium film 6b can be formed without damaging the gate insulating film 5 and the like. The thickness of the silicon germanium film 6b can be, for example, about 50 nm. Also, a polycrystalline film or an amorphous film can be used as the silicon germanium film 6b. The ratio of silicon (Si) and germanium (Ge) in the silicon germanium film 6b can be controlled by adjusting the gas ratio between the silicon source gas (for example, silane-based gas such as monosilane ($SiH_4$)) and the germanium source gas (for example, germane-based gas such as monogermane ($GeH_4$)) in the CVD film forming process. Also, the silicon germanium film 6b is preferably a silicon germanium film not doped with any impurity (dopant) (nondope polysilicon germanium film or nondope amorphous silicon germanium film).

Next, an insulating film (hard mask layer) 7b made of silicon oxide is formed on the silicon film 6b. The thickness of the insulating film 7b can be, for example, about 50 to 100 nm.

Figure 5:
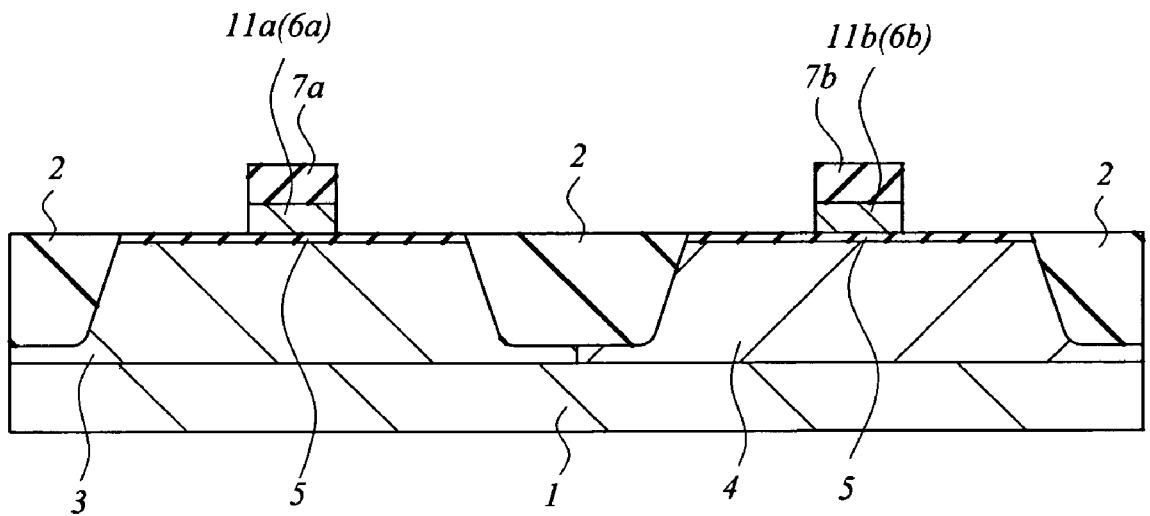
FIG. 5 is a cross-sectional view showing the principal part in the manufacturing process of a semiconductor device subsequent to FIG. 4.

Next, as shown in FIG. 5, a laminated film composed of the silicon germanium film 6b and the insulating film 7b is formed through the patterning process (patterning, processing, selective removal) using the photolithography method and the dry etching method. For example, the reactive ion etching (RIE) can be used in this patterning process. The patterned silicon germanium film 6b forms a dummy gate electrode (dummy electrode) 11b on the n type well 4 via the gate insulating film 5. More specifically, the dummy gate electrode 11b for the p channel MISFET is composed of the silicon germanium film 6b on the gate insulating film 5 of the n type well 4. This gate electrode 11b is to be a metal gate electrode (gate electrode 31b) of the p channel MISFET through the reaction process with a metal film 25 described later. Also, since the insulating film 7a also functions as an etching mask in the dry etching process of the silicon germanium film 6b, the etching of the silicon film 6 constituting the gate electrode 11a can be prevented.

Figure 6:
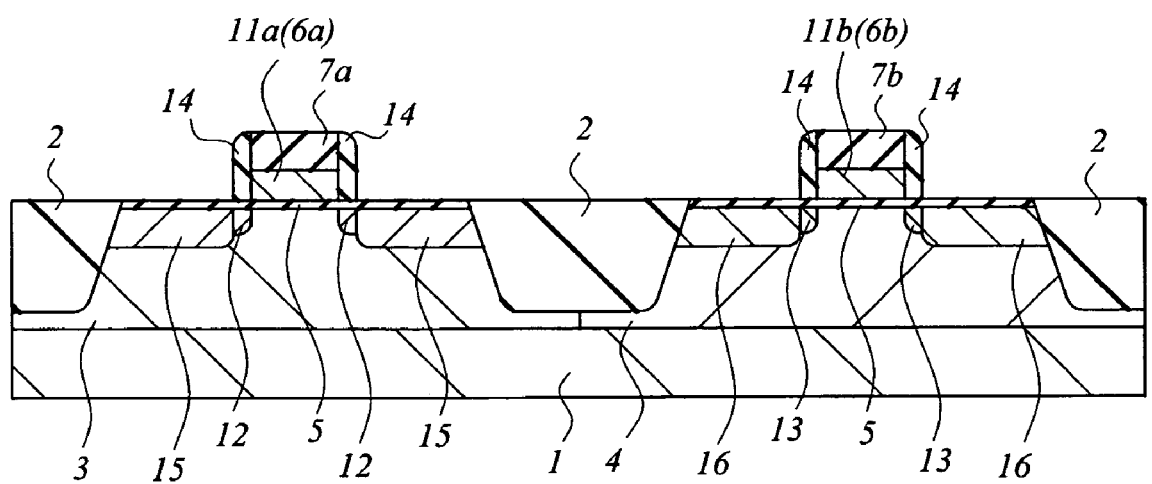
FIG. 6 is a cross-sectional view showing the principal part in the manufacturing process of a semiconductor device subsequent to FIG. 5.

Next, as shown in FIG. 6, an n type impurity such as phosphorus (P) or arsenic (As) is ion-implanted into the regions on both sides of the gate electrode 11a of the p type well 3 to form (a pair of) $n^-$ type semiconductor regions 12 aligned with the gate electrode 11a of the p type well 3. Then, a p type impurity such as boron (B) is ion-implanted into the regions on both sides of the gate electrode 11b of the n type well 4 to form (a pair of) $p^-$ type semiconductor regions 13 aligned with the gate electrode 11b of the n type well 4.

Next, sidewalls (sidewall spacer, sidewall insulating film) 14 made of an insulator such as silicon nitride are formed on the sidewalls of the gate electrodes 11a and 11b. The sidewalls 14 are formed by such as depositing a silicon nitride film on the semiconductor substrate 1 and then performing the anisotropic etching of the silicon nitride film.

After forming the sidewalls 14, the ion implantation of an n type impurity such as phosphorus (P) or arsenic (As) into the regions on both sides of the gate electrode 11a and the sidewalls 14 of the p type well 3 is performed to form (a pair of) $n^+$ type semiconductor regions 15 (source, drain) aligned with the sidewalls 14 of the gate electrode 11a of the p type well 3, and the ion implantation of a p type impurity such as boron (B) into the regions on both sides of the gate electrode 11b and the sidewalls 14 of the n type well 4 is performed to form (a pair of) $p^+$ type semiconductor regions 16 (source, drain) aligned with the sidewalls 14 of the gate electrode 11b of the n type well 4.

After the ion implantation, the annealing process for activating the introduced impurity (activation annealing, thermal treatment) is performed. By the annealing process at, for example, about 950° C., the impurity introduced into the $n^-$ type semiconductor region 12, the $p^-$ type semiconductor region 13, the $n^+$ type semiconductor region 15, and the $p^+$ type semiconductor region 16 can be activated. In the case where the silicon film 6a and the silicon germanium film 6b are amorphous films when they are formed, they may become polycrystalline films by this annealing process.

Also, in the case where the silicon germanium film 6b constituting the gate electrode 11b is the silicon germanium film doped with an impurity, more particularly, in the case of the silicon germanium film doped with boron (B), there is the possibility that the boron (B) penetrates through the gate insulating film 5 and diffuses into the channel region below the gate insulating film 5 in this annealing process. However, since the nondope silicon germanium film not doped with any impurity is used as the silicon germanium film 6b constituting the gate electrode 11b in this embodiment as described above, it is possible to prevent an impurity such as boron (B) from penetrating through the gate insulating film 5 and diffusing into the channel region below the gate insulating film 5 in this annealing process.

By the annealing process described above, the impurity introduced into the $n^-$ type semiconductor region 12, the $p^-$ type semiconductor region 13, the $n^+$ type semiconductor region 15, and the $p^+$ type semiconductor region 16 is activated. As a result, n type semiconductor regions (impurity diffusion layer) functioning as the source or drain of the n channel MISFET are composed of the $n^+$ type semiconductor region 15 and the $n^-$ type semiconductor region 12, and p type semiconductor regions (impurity diffusion layer) functioning as the source or drain of the p channel MISFET are composed of the $p^+$ type semiconductor region 16 and the $p^-$ type semiconductor region 13. The impurity concentration of the $n^+$ type semiconductor region 15 is higher than that of the $n^-$ type semiconductor region 12, and the impurity concentration of the $p^+$ type semiconductor region 16 is higher than that of the $p^-$ type semiconductor region 13.

Figure 7:
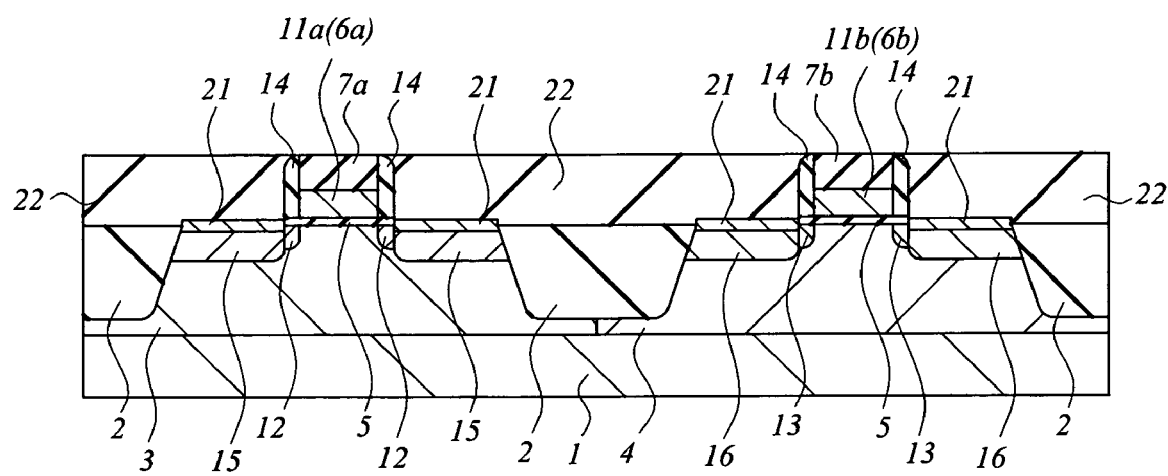
FIG. 7 is a cross-sectional view showing the principal part in the manufacturing process of a semiconductor device subsequent to FIG. 6.

Next, as shown in FIG. 7, the etching (for example, wet etching using dilute hydrofluoric acid) is performed according to need to expose the surfaces of the $n^+$ type semiconductor region 15 and the $p^+$ type semiconductor region 16 (at this time, the insulating films 7a and 7b on the gate electrodes 11a and 11b are not removed so as not to expose the surfaces of the gate electrodes 11a and 11b). Thereafter, a metal film such as a cobalt (Co) film is deposited on the semiconductor substrate 1 including on the $n^+$ type semiconductor region 15 and the $p^+$ type semiconductor region 16, and then, the thermal treatment of the metal film is performed. By doing so, a metal silicide film (cobalt silicide film) 21 is formed on each of the surfaces of the n⁺ type semiconductor region 15 and the p⁺ type semiconductor region 16. This metal silicide film 21 can reduce the diffusion resistance and the contact resistance of the source and drain. Thereafter, the unreacted metal film (cobalt film) is removed. At this time, since the insulating films 7a and 7b exist on the gate electrodes 11a and 11b, the metal silicide film is not formed on the surfaces of the gate electrodes 11a and 11b. Although it is possible to reduce the diffusion resistance and the contact resistance by forming the metal silicide film 21 on the surfaces of the n⁺ type semiconductor region 15 and the p⁺ type semiconductor region 16, the step of forming the metal silicide film 21 can be omitted if the metal silicide film 21 is not necessary.

Next, an insulating film 22 is formed on the semiconductor substrate 1. More specifically, the insulating film 22 is formed on the semiconductor substrate 1 so as to cover the gate electrodes 11a and 11b. The insulating film 22 is, for example, a silicon oxide film (for example, TEOS (Tetraethoxysilane oxide film)). When the process for forming the insulating film 22 is performed at a relatively high temperature, a cobalt silicide film is preferably used as the metal silicide film 21. However, when the process for forming the insulating film 22 is performed at a relatively low temperature, a nickel silicide film is also available as the metal silicide film 21.

Next, the upper surface of the insulating film 22 is planarized by the CMP (Chemical Mechanical Polishing) method to expose the surfaces of the insulating films 7a and 7b. After the CMP, the structure shown in FIG. 7 is obtained.

Figure 8:
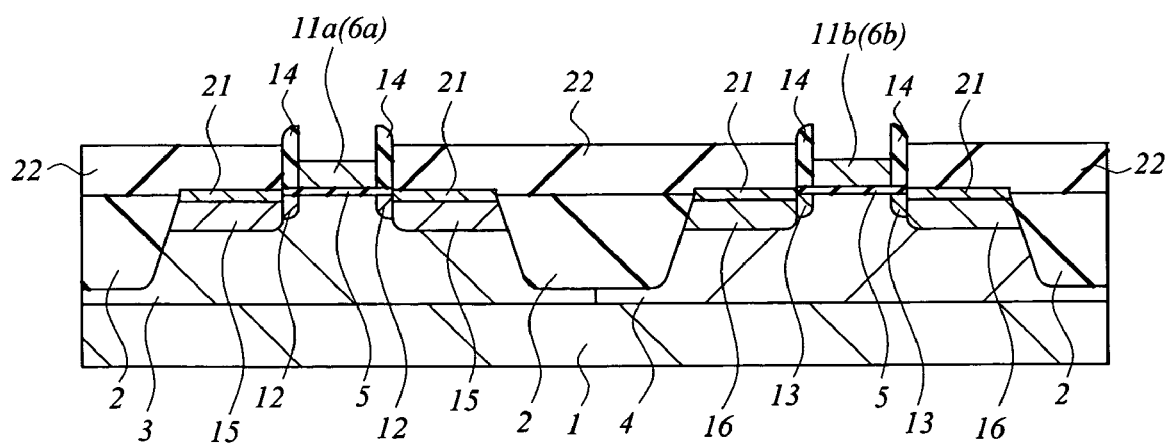
FIG. 8 is a cross-sectional view showing the principal part in the manufacturing process of a semiconductor device subsequent to FIG. 7.

Next, as shown in FIG. 8, the insulating films 7a and 7b on the gate electrodes 11a and 11b are etched and removed to expose the surfaces (upper surface) of the gate electrodes 11a and 11b. For example, the insulating films 7a and 7b on the gate electrodes 11a and 11b can be removed by the wet etching using hydrofluoric acid. Also, since the thickness of the insulating film 22 is larger than that of the insulating films 7a and 7b, the insulating film 22 is not completely removed even when the insulating films 7a and 7b on the gate electrodes 11a and 11b are etched and removed. In addition, since a material different from that of the insulating films 7a and 7b is used to form the sidewalls 14, that is, a silicon oxide film is used to form the insulating films 7a and 7b and a silicon nitride film is used to form the sidewalls 14, the sidewalls 14 are not removed when the insulating films 7a and 7b on the gate electrodes 11a and 11b are etched and removed.

Figure 9:
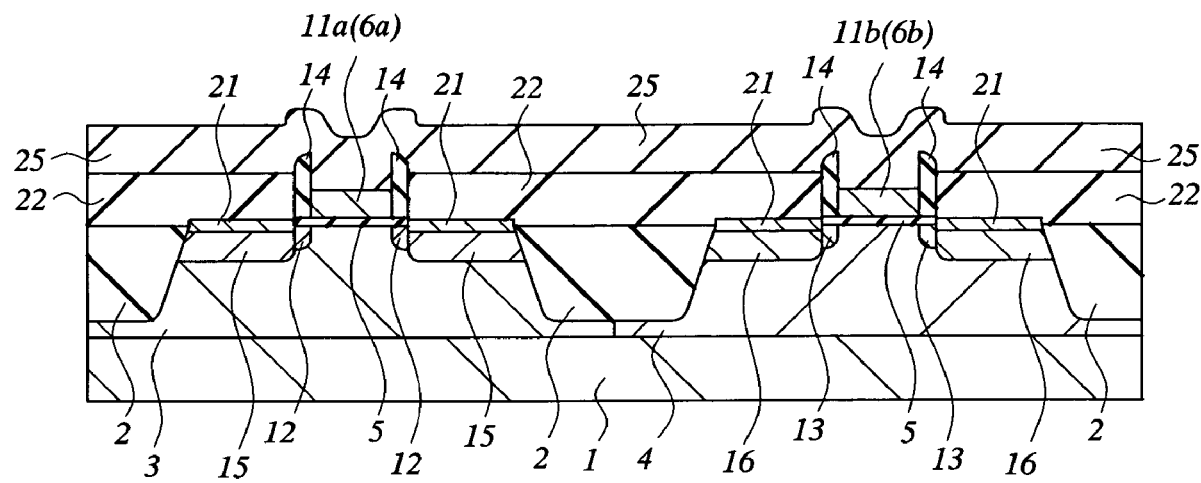
FIG. 9 is a cross-sectional view showing the principal part in the manufacturing process of a semiconductor device subsequent to FIG. 8.

Next, as shown in FIG. 9, a metal film (Ni film) 25 is formed on the semiconductor substrate 1. More specifically, the metal film 25 is formed on the semiconductor substrate 1 including on the upper surfaces of the gate electrodes 11a and 11b. The metal film 25 is a metal film mainly made of nickel (Ni), that is, an Ni (nickel) film. The metal film 25 can be formed by, for example, the sputtering method. Since the metal film 25 is formed after removing the insulating films 7a and 7b on the gate electrodes 11a and 11b to expose the surfaces of the gate electrodes 11a and 11b as described above, the upper surfaces of the gate electrodes 11a and 11b are brought into contact with the metal film 25.

Figure 10:
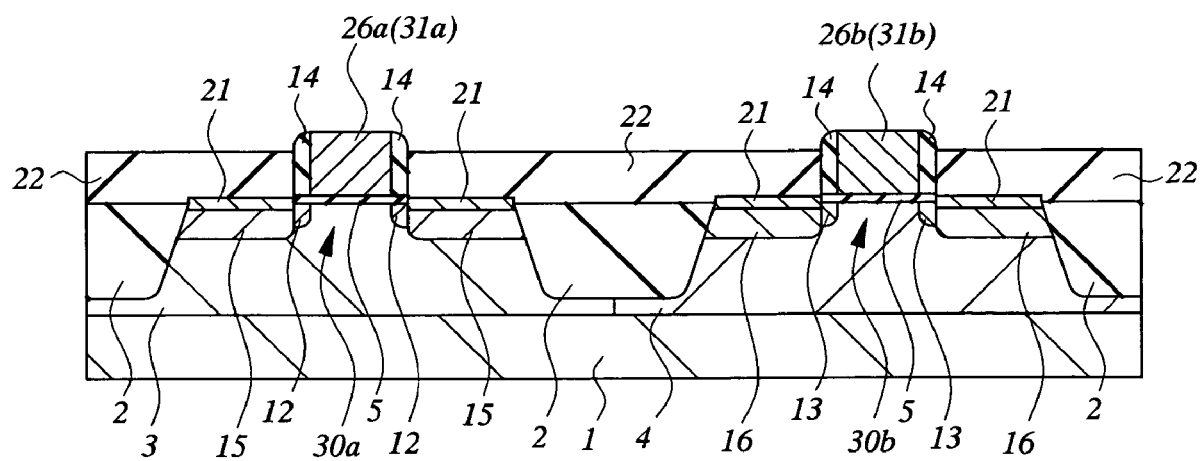
FIG. 10 is a cross-sectional view showing the principal part in the manufacturing process of a semiconductor device subsequent to FIG. 9.

Next, as shown in FIG. 10, the metal film 25 is reacted with the gate electrodes 11a and 11b by the thermal treatment to form conductive films (metal film, metal compound film) 26a and 26b. More specifically, by the thermal treatment, the silicon film 6a constituting the gate electrode 11a is reacted with the metal film 25 to form the conductive film 26a, and the silicon germanium film 6b constituting the gate electrode 11b is reacted with the metal film 25 to form the conductive film 26. For example, by the thermal treatment in the nitrogen gas atmosphere at about 400° C., the metal film 25 is reacted with the gate electrodes 11a and 11b to form the conductive films 26a and 26b. At this time, all of the silicon film 6a and silicon germanium film 6b constituting the gate electrodes 11a and 11b are completely reacted with the metal film 25 to form the conductive films 26a and 26b. Since the metal film 25 is an Ni (nickel) film as described above, the conductive film 26a is made of nickel silicide ($Ni_ySi$: y>0), and the conductive film 26b is made of nickel-silicon-germanium ($Ni_ySi_{1-x}Ge_x$: $1 \geq x > 0$, y>0). Thereafter, the unreacted metal film 25 is removed. For example, the unreacted metal film 25 can be removed by the SPM process (process using sulfuric acid ($H_2SO_4$)/hydrogen peroxide ($H_2O_2$)/water ($H_2O$) solution (SPM)).

As described above, the metal film 25 (Ni film) is reacted with the silicon film 6a constituting the gate electrode 11a to form the conductive film (nickel silicide film) 26a made of nickel silicide ($Ni_ySi$: y>0). Since an impurity (dopant) functioning as an n type impurity to the silicon film such as phosphorus (P), antimony (Sb), and arsenic (As) has been introduced (doped) into the silicon film 6a, the impurity introduced into the silicon film 6a exists also in the conductive film 26a. Therefore, the conductive film 26a is made of nickel silicide ($Ni_ySi$: y>0) doped with at least one of impurities functioning as an n type impurity to the silicon film such as phosphorus (P), antimony (Sb), and arsenic (As) This conductive film 26a is to be a gate electrode 31a of the n channel MISFET 30a. Since the gate electrode 31a of the n channel MISFET 30a is composed of the conductive film 26a which is a nickel silicide film (showing metallic conduction), the gate electrode 31a is a metal gate electrode.

Also, as described above, the metal film 25 (Ni film) is reacted with the silicon germanium film 6b constituting the gate electrode 11b to form the conductive film (nickel-silicon-germanium film) 26b made of nickel-silicon-germanium ($Ni_ySi_{1-x}Ge_x$: $1 \geq x > 0$, y>0). Since an impurity (dopant) has not been introduced (doped) into the silicon germanium film 6b, no impurity is introduced into the conductive film 26b. Particularly, boron (B) is not introduced (not contained) in the conductive film 26b. Therefore, the conductive film 26b is made of nickel-silicon-germanium ($Ni_ySi_{1-x}Ge_x$: $1 \geq x > 0$, y>0) not doped with any impurity such as boron (B). This conductive film 26b is to be a gate electrode 31b of the p channel MISFET 30b. Since the gate electrode 31b of the p channel MISFET 30b is composed of the conductive film 26b which is a nickel-silicon-germanium film (showing metallic conduction), the gate electrode 31b is a metal gate electrode.

Figure 11:
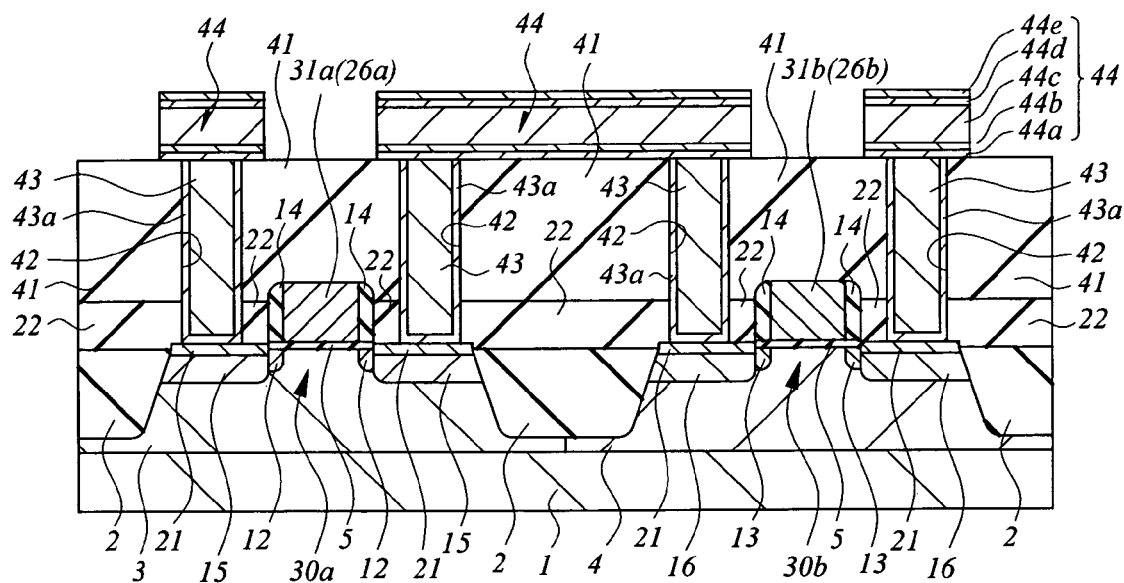
FIG. 11 is a cross-sectional view showing the principal part in the manufacturing process of a semiconductor device subsequent to FIG. 10.

Next, as shown in FIG. 11, an insulating film 41 is formed on the semiconductor substrate 1. More specifically, the insulating film 41 is formed on the semiconductor substrate 1 (on the insulating film 22) so as to cover the gate electrodes 31a and 31b. The insulating film 41 is composed of, for example, a silicon oxide film (TEOS oxide film). Then, the upper surface of the insulating film 41 is planarized by the CMP method according to need.

Next, the insulating films 41 and 22 are dry-etched with using a photoresist pattern (not shown) formed on the insulating film 41 by the photolithography method as an etching mask. By doing so, contact holes (opening) 42 are formed on the n⁺ type semiconductor regions 15 (source, drain), the p⁺ type semiconductor regions 16 (source, drain), and the gate electrodes 31a and 31b. A part of the main surface of the semiconductor substrate 1, for example, a part of (the metal silicide film 21 on the surface of) the n⁺ type semiconductor region 15, a part of (the metal silicide film 21 on the surface of) the p+ type semiconductor region 16, or a part of the gate electrodes 31a and 31b are exposed at the bottom portions of the contact holes 42. Note that, in the cross-sectional view in FIG. 10, a part of (the metal silicide film 21 on the surface of) the n+ type semiconductor region 15 and a part of (the metal silicide film 21 on the surface of) the p+ type semiconductor region 16 are exposed at the bottom portions of the contact holes 42. However, the contact holes 42 are formed also on the gate electrodes 31a and 31b in the other region (cross section not shown), and the part of the gate electrodes 31a and 31b are exposed at the bottom portions of the contact holes 42.

Next, a plug 43 made of tungsten (W) is formed in the contact hole 42. The plug 43 is formed in the following manner. For example, after forming a barrier film (for example, titanium nitride film) 43a on the insulating film 41 including inside of the contact holes 42, a tungsten film is formed on the barrier film 43a by such as the CVD method so as to fill the contact holes 42, and the unnecessary tungsten film and barrier film 43a on the insulating film 41 are removed by the CMP method or the etch-back method.

Next, a wiring (first wiring layer) 44 is formed on the insulating film 41 in which the plugs 43 are embedded. The wiring 44 is formed in the following manner. For example, after sequentially forming a titanium film 44a, titanium nitride film 44b, an aluminum film 44c, a titanium film 44d, and a titanium nitride film 44e by the sputtering method, the films are patterned by the photolithography method and the dry etching. The aluminum film 44c is a conductive film mainly made of aluminum such as single aluminum (Al) or aluminum alloy. The wiring 44 is electrically connected to the n+ type semiconductor regions 15 to be the source and the drain of the n channel MISFET 30a, the p+ type semiconductor regions 16 to be the source and the drain of the p channel MISFET 30b, the gate electrode 31a of the n channel MISFET 30a, or the gate electrode 31b of the p channel MISFET 30b via the plugs 43. The wiring 44 is not limited to the above-described aluminum wiring and can be changed to various types of other wirings. For example, a tungsten wiring and a copper wiring (for example, buried copper wiring formed by the damascene method) are also available. Thereafter, an interlayer insulating film and an upper wiring layer are further formed. However, the description thereof is omitted here. The embedded copper wirings formed by the damascene method can be used as the second and subsequent layer wirings.

The semiconductor device according to this embodiment manufactured through the process described above is provided with a CMISFET having the n channel MISFET 30a and the p channel MISFET 30b formed on the main surface of the semiconductor substrate 1, and the gate electrodes 31a and 31b of the MISFETs 30a and 30b are the metal gate electrodes composed of the conductive films 26a and 26b.

As described above, the gate electrode 31a (that is, conductive film 26a) of the n channel MISFET 30a is formed by the reaction between the Ni film (metal film 25) and the silicon film 6a (gate electrode 11a) and is made of nickel silicide ($Ni_ySi$: y>0). Also, since an impurity (dopant) functioning as an n type impurity to the silicon film such as phosphorus (P), antimony (Sb) or arsenic (As) is introduced (doped) into the silicon film 6a, the impurity introduced into the silicon film 6a such as phosphorus (P), antimony (Sb) or arsenic (As) exists also in the conductive film 26a. Therefore, the gate electrode 31a (conductive film 26a) of the n channel MISFET 30a is made of nickel silicide ($Ni_ySi$: y>0) doped with at least one of impurities functioning as an n type impurity to the silicon film such as phosphorus (P), antimony (Sb), and arsenic (As).

Meanwhile, the gate electrode 31b (that is, conductive film 26b) of the p channel MISFET 30b is formed as described above by the reaction between the Ni film (metal film 25) and the silicon germanium film 6b (gate electrode 11b) and is made of nickel-silicon-germanium ($Ni_ySi_{1-x}Ge_x$: $1 \geq x > 0$, y>0). Also, since an impurity (dopant) such as boron (B) has not been introduced (doped) into the silicon germanium film 6b, no impurity such as boron (B) is introduced into the conductive film 26b. Therefore, the gate electrode 31b (conductive film 26b) of the p channel MISFET 30b is made of nickel-silicon-germanium ($Ni_ySi_{1-x}Ge_x$: $1 \geq x > 0$, y>0) not doped with any impurity such as boron (B).

Figure 12:
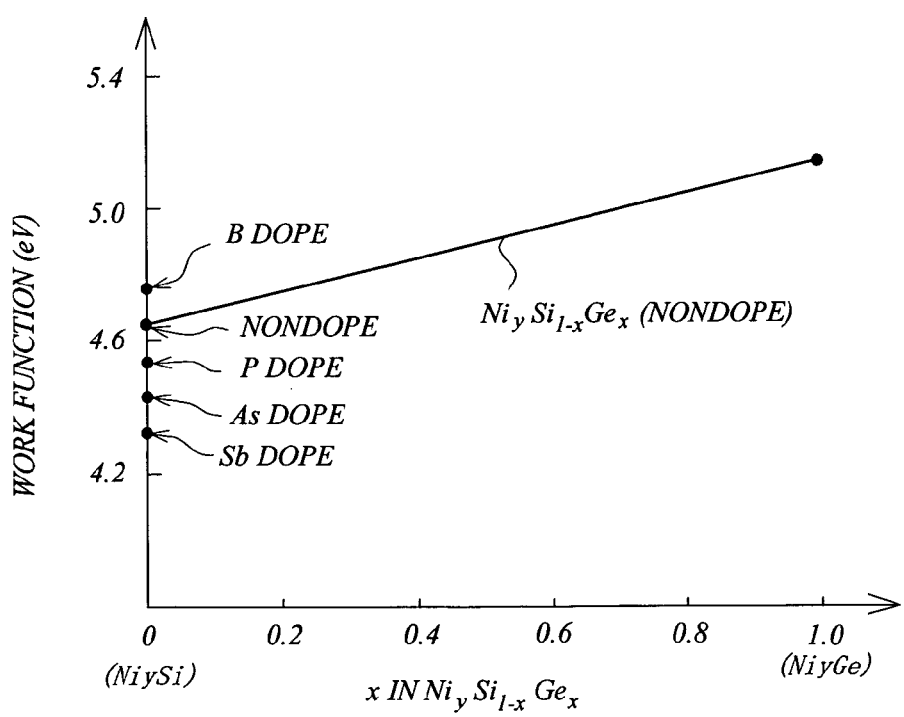
FIG. 12 is a graph showing the work function of $Ni_ySi_{1-x}Ge_x$.

FIG. 12 is a graph showing the work function of $Ni_ySi_{1-x}Ge_x$. The abscissas axis of the graph in FIG. 12 corresponds to x (ratio of Ge) in $Ni_ySi_{1-x}Ge_x$ (nickel-silicon-germanium), and the ordinate axis of the graph in FIG. 12 corresponds to the work function. The $Ni_ySi_{1-x}Ge_x$ with x=0 corresponds to nickel silicide ($Ni_ySi$), and the $Ni_ySi_{1-x}Ge_x$ with x=1 corresponds to nickel germanium ($Ni_yGe$). Also, the graph in FIG. 12 plots the work functions of the nickel silicide ($Ni_ySi$) doped with impurities (B (boron), P (phosphorus), As (arsenic), Sb (antimony)).

As is apparent from the graph in FIG. 12, the work function of nickel silicide ($Ni_ySi$) is about 4.65 eV, the work function of nickel germanium ($Ni_yGe$) is about 5.2 eV, and the work function of $Ni_ySi_{1-x}Ge_x$ is about 4.65 to 5.2 eV depending on the value of x. By increasing the ratio of Ge in the nickel-silicon-germanium (x in $Ni_ySi_{1-x}Ge_x$), the work function can be increased. Therefore, by adjusting the value of x (ratio of Ge) in $Ni_ySi_{1-x}Ge_x$ (nickel-silicon-germanium), the work function of nickel-silicon-germanium ($Ni_ySi_{1-x}Ge_x$) can be controlled to a desired value.

In this embodiment, by adjusting the Ge concentration (x in $Ni_ySi_{1-x}Ge_x$) of the gate electrode 31b made of nickel-silicon-germanium ($Ni_ySi_{1-x}Ge_x$) of the p channel MISFET 30b, the work function of the gate electrode 31b can be controlled to a desired value and the threshold voltage of the p channel MISFET 30b can be controlled. In addition, the reduction of the (absolute value of) threshold voltage of the p channel MISFET 30b can be achieved.

For example, by adjusting x in $Ni_ySi_{1-x}Ge_x$ (nickel-silicon-germanium) to 0.2 or more ($x \geq 0.2$), that is, when $Ni_ySi_{1-x}Ge_x$ ($1 \geq x \geq 0.2$, y>0) is used to form the gate electrode 31b of the p channel MISFET 30b, the work function of the gate electrode 31b of the p channel MISFET 30b can be made higher than the work function of the nickel silicide ($Ni_ySi$) by about 0.1 eV or more (for example, 4.75 eV or higher), and the work function of the gate electrode 31b can be increased more than the case where B (boron) is doped into nickel silicide ($Ni_ySi$). As described above, by using nickel-silicon-germanium ($Ni_ySi_{1-x}Ge_x$) to form the gate electrode 31b of the p channel MISFET 30b, the work function of the gate electrode 31b can be increased in comparison to the case where the nondope nickel silicide ($Ni_ySi$) is used to form the gate electrode 31b. More particularly, by adjusting x in $Ni_ySi_{1-x}Ge_x$ constituting the gate electrode 31b to 0.2 or more, the work function of the gate electrode 31b can be increased more than the case where nickel silicide ($Ni_ySi$) doped with B (boron) is used to form the gate electrode 31b, and the reduction of the (absolute value of) threshold voltage of the p channel MISFET 30b can be achieved. Note that the Ge concentration (corresponding to x in $Ni_ySi_{1-x}Ge_x$) of the gate electrode 31b of the p channel MISFET 30b can be controlled by adjusting the Ge ratio (concentration) in the silicon germanium film 6b.

Also, as shown in the graph in FIG. 12, by introducing an n type impurity to nickel silicide ($Ni_ySi$), the work function can be reduced. For example, by doping P (phosphorus), As (arsenic), or Sb (antimony) into nickel silicide ($Ni_ySi$), the work function can be reduced by about 0.1 to 0.3 eV in comparison to the nondope nickel silicide ($Ni_ySi$). The work function is reduced most when Sb (antimony) is doped, and the work function can be reduced by about 0.3 eV in comparison to the nondope nickel silicide ($Ni_ySi$). Meanwhile, when a p type impurity is introduced to nickel silicide ($Ni_ySi$), the work function can be increased. For example, by doping B (boron) into nickel silicide ($Ni_ySi$), the work function can be increased by about 0.1 eV in comparison to the nondope nickel silicide ($Ni_ySi$).

In this embodiment, as described above, the gate electrode 31a of the n channel MISFET 30a is made of nickel silicide ($Ni_ySi$: y>0), and an impurity such as phosphorus (p), antimony (Sb), or arsenic (As) is introduced therein. Therefore, the work function of the gate electrode 31a of the n channel MISFET 30a can be made lower than the work function of the nondope nickel silicide ($Ni_ySi$) by about 0.1 to 0.3 eV. Therefore, the work function of the gate electrode 31a of the n channel MISFET 30a is lower than the work function of the gate electrode 31b of the p channel MISFET 30b. In this embodiment, by doping an n type impurity such as phosphorus (P), antimony (Sb), or arsenic (As), the work function of the gate electrode 31a can be controlled and the threshold voltage of the n channel MISFET 30a can be controlled. In addition, the reduction of the (absolute value of) threshold voltage of the p channel MISFET 30a can be achieved.

In this embodiment as described above, for the n channel type MISFET 30a, an impurity such as phosphorus (P), antimony (Sb), or arsenic (As) is introduced into the gate electrode 31a. By doing so, the work function of the gate electrode 31a is controlled (is made lower than that of the nondope nickel silicide), and the threshold voltage of the n channel MISFET 30a is controlled (threshold voltage is reduced). Also, for the p channel MISFET 30b, nickel-silicon-germanium ($Ni_ySi_{1-x}Ge_x$) is used to form the gate electrode 31b, and the work function of the gate electrode 31b is controlled (is made higher than that of nickel silicide) by adjusting the Ge ratio. By doing so, the threshold voltage of the p channel MISFET 30b is controlled (threshold voltage is reduced). Consequently, it is possible to reduce the threshold voltage of both of the n channel MISFET 30a and the p channel MISFET 30b of the CMISFET, and the performance of a semiconductor device having the CMISFET can be improved.

Also, in the case where the work function of the gate electrode is adjusted only by the dopant (such as P, As, Sb, B), the variation range of the work function of the gate electrode (gate electrode doped with B) in the p channel MISFET is smaller than that of the work function of the gate electrode (gate electrode doped with P, As, or Sb) in the n channel MISFET. More specifically, by doping such as Sb (antimony), the work function of the gate electrode of the n channel MISFET can be reduced by about 0.3 eV in comparison to that of nondope nickel silicide. However, the work function of the gate electrode of the p channel MISFET can be increased only by about 0.1 (to 0.2) eV in comparison to that of the nondope nickel silicide even if B (boron) or the like is doped therein. Meanwhile, in this embodiment, the work function of the gate electrode 31b of the p channel MISFET 30b is controlled by adjusting the Ge concentration. Therefore, the variation range of the work function of the gate electrode 31b of the p channel MISFET 30b can be relatively increased. For example, by adjusting x in $Ni_ySi_{1-x}Ge_x$ constituting the gate electrode 31b to 0.2 or more, the work function of the gate electrode 31b can be increased more than the case where nickel silicide ($Ni_ySi$) doped with B (boron) is used to form the gate electrode. Further, by increasing the Ge concentration of the gate electrode 31b (x in $Ni_ySi_{1-x}Ge_x$), the work function can be increased by about 0.3 eV or more in comparison to that of nondope nickel silicide. Therefore, the gate electrodes 31a and 31b with good symmetry can be located around midgap, and thus, the CMISFET with good characteristics can be acquired.

Furthermore, in this embodiment, for the n channel MISFET 30a, the silicon film 6a (gate electrode 11a) is reacted with the metal film 25 (Ni film) to form the gate electrode 30a made of nickel silicide ($Ni_ySi$). However, as another embodiment, a silicon germanium film (this silicon germanium film is doped with an n type impurity such as phosphorus (P), antimony (Sb), or arsenic (As)) with the Ge concentration lower than that of the silicon germanium film 6 is used instead of the silicon film 6a, and the gate electrode 31a of the n channel MISFET 30a made of nickel-silicon-germanium ($Ni_ySi_{1-x}Ge_x$) can be formed by reacting the silicon germanium film with low Ge concentration with the metal film 25 (Ni film). In this case, the Ge concentration (corresponding to x in $Ni_ySi_{1-x}Ge_x$) of the gate electrode 31a of the n channel MISFET 30a is lower than the Ge concentration (corresponding to x in $Ni_ySi_{1-x}Ge_x$) of the gate electrode 31b of the p channel MISFET 30b. The difference in work function can be made between the gate electrode 31a and the gate electrode 31b (that is, the work function of the gate electrode 31b of the p channel MISFET 30b can be made higher than the work function of the gate electrode 31a of the n channel MISFET 30a) by the difference in the Ge concentration between the gate electrode 31a and the gate electrode 31b. Therefore, the gate electrodes 31a and 31b with good symmetry can be located around midgap, and thus, the CMISFET with good characteristics can be acquired. In addition, the threshold voltage can be reduced. However, the case where the silicon film 6a (gate electrode 11a) is reacted with the metal film 25 (Ni film) to form the gate electrode 30a made of nickel silicide ($Ni_ySi$) (that is, the case where the gate electrode 30a does not contain Ge) described in this embodiment is more preferable because the difference in work function between the gate electrode 31a and the gate electrode 31b becomes the largest, the gate electrodes 31a and 31b with good symmetry can be more precisely formed around midgap, and the threshold voltage can be advantageously reduced.

Therefore, the gate electrode 31a of the n channel MISFET 30a and the gate electrode 31b of the p channel MISFET 30b are composed of a conductive film (metal film, metal compound film) made of at least one of Si and Ge and Ni, and the Ge concentration of the conductive film (metal film, metal compound film) constituting the gate electrode 31b of the p channel MISFET 30b is higher than that of the conductive film (metal film, metal compound film) constituting the gate electrode 31a of the n channel MISFET 30a. Also, it is more preferable that the gate electrode 31a of the n channel MISFET 30a is made of nickel silicide containing no Ge and that the gate electrode 31b of the p channel MISFET 30b is made of $Ni_ySi_{1-x}Ge_x$ containing Ge as described in this embodiment.

Also, in the case where the silicon germanium film in which a p type impurity such as B (boron) is introduced (for example, B doped polysilicon germanium film) is used as the silicon germanium film 6b constituting the gate electrode 11b of the p channel MISFET, there is the possibility that the p type impurity (boron) in the silicon germanium film constituting the gate electrode 11b of the p channel MISFET penetrates through the gate insulating film 5 and diffuses in the channel region below the gate insulating film 5 in the annealing process for activating the impurity introduced into this silicon germanium film 6b, the n⁻ type semiconductor region 12, the p⁻ type semiconductor region 13, the n⁺ type semiconductor region 15, and the p⁺ type semiconductor region 16 (activation annealing). As a result, the performance and reliability of the semiconductor device may be deteriorated.

For its prevention, a nondope silicon germanium film in which no impurity is introduced is used to form the silicon germanium film 6b constituting the gate electrode 11a in this embodiment. Therefore, it is possible to prevent the p type impurity (boron) from penetrating through the gate insulating film 5 and from diffusing in the channel region below the gate insulating film 5 in the annealing process for activating the impurity introduced into the n⁻ type semiconductor region 12, the p⁻ type semiconductor region 13, the n⁺ type semiconductor region 15, and the p⁺ type semiconductor region 16 (activation annealing). As a result, the performance and reliability of the semiconductor device can be improved.

Also, when a metal film is directly formed on the gate insulating film 5 by the sputtering method unlike this embodiment, there is the possibility that the gate insulating film 5 is damaged. However, in this embodiment, the silicon film 6a and the silicon germanium film 6b are formed on the gate insulating film 5 by the CVD method, and the silicon film 6 and the silicon germanium film 6b (gate electrodes 11a and 11b) are reacted with the metal film 25b formed thereon to form the gate electrodes 31a and 31b as the metal gate electrodes. Therefore, it is possible to prevent the gate insulating film 5 from being damaged.

Also, since a metal film mainly made of Ni (Ni film) is used as the metal film 25 in this embodiment, the full silicidation can be made by the thermal treatment at a relatively low temperature. More specifically, the temperature of the thermal treatment in which the silicon film 6a and the silicon germanium film 6b (gate electrodes 11a and 11b) are reacted with the metal film 25 to form the conductive films 26a and 26b (gate electrodes 31a and 31b) can be made relatively low. In addition, all of the silicon film 6a and the silicon germanium film 6b constituting the gate electrodes 11a and 11b can be reacted with the metal film 25 to form the conductive films 26a and 26b (gate electrodes 31a and 31b), and therefore, it is possible to prevent the unreacted silicon film 6a and silicon germanium film 6b from being left on the gate insulating film 5. Furthermore, it is possible to suppress or prevent the reaction between the gate insulating film 5 and the semiconductor substrate 1 and between the gate insulating film 5 and the silicon film 6a or the silicon germanium film 6b in the thermal treatment process. As a result, the performance and reliability of the semiconductor device can be further improved.

Also, when the source and drain regions are formed after forming the metal gate electrode unlike this embodiment, there is the possibility that the electrical characteristics of the MISFET are deteriorated because the metal constituting the gate electrode is reacted with the gate insulating film, the gate electrode is peeled from the gate insulating film, or the metal atoms of the gate electrode are diffused in the gate insulating film and the silicon substrate in the high-temperature annealing for activating the impurity introduced into the source and drain regions by the ion implantation method (activation annealing). In this embodiment, after the annealing process for activating the impurity introduced (ion-implanted) into the source and drain regions (n⁻ type semiconductor region 12, the p⁻ type semiconductor region 13, the n⁺ type semiconductor region 15, and the p⁺ type semiconductor region 16) of the MISFET, the silicon film 6 and the silicon germanium film 6b (gate electrodes 11a and 11b) are reacted with the metal film 25 formed thereon to form the gate electrodes 31a and 31b. Therefore, it is possible to prevent the reaction between the gate electrode and the gate insulating film, the peeling of the gate electrode from the gate insulating film, and the diffusion of metal atoms of the gate electrode into the insulating film and the silicon substrate in the annealing process for activating the impurity. As a result, the deterioration of the electrical characteristics of the MISFET can be prevented.

Also, in this embodiment, after forming the gate electrodes 11a and 11b composed of the silicon film 6a and the silicon germanium film 6b, they are reacted with the metal film 25 to form the gate electrodes 31a and 31b. Therefore, the manufacturing line and the manufacturing apparatus for a semiconductor device with a conventional polysilicon gate electrode structure can be used without modification, and the semiconductor device with a metal gate electrode structure can be easily manufactured at low cost.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effectively applied to a semiconductor device provided with a MISFET having metal gate electrodes and a manufacturing method thereof.

What is claimed is:

1. A semiconductor device, comprising:
   an n channel first MISFET; and
   a p channel second MISFET,
   wherein a first gate electrode of said first MISFET is composed of a first conductive film made of Si and Ni,
   a second gate electrode of said second MISFET is composed of a second conductive film made of at least one of Si and Ge and Ni,
   said first conductive film is made of nickel silicide containing no Ge, and
   said second conductive film is made of $Ni_ySi_{1-x}Ge_x$ containing Ge.

2. A manufacturing method of a semiconductor device having an n channel first MISFET and a p channel second MISFET, comprising the steps of:
   (a) preparing a semiconductor substrate;
   (b) forming a first insulating film for a gate insulating film on said semiconductor substrate;
   (c) forming a first dummy electrode of said first MISFET composed of a patterned silicon film on said first insulating film, and forming a second dummy electrode of said second MISFET composed of a patterned silicon germanium film on said first insulating film;
   (d) forming a metal film mainly made of nickel on said first dummy electrode and said second dummy electrode; and (e) forming a first gate electrode of said first MISFET made of nickel silicide by reacting said silicon film constituting said first dummy electrode with said metal film, and forming a second gate electrode of said second MISFET made of $Ni_y Si_{1-x} Ge_x$ by reacting said silicon germanium film constituting said second dummy electrode with said metal film, wherein said silicon film is a silicon film doped with at least one of P, As, and Sb, and said silicon germanium film is a silicon germanium film in which no impurity is introduced.

* * * * *

UNITED STATES PATENT AND TRADEMARK OFFICE
CERTIFICATE OF CORRECTION

PATENT NO. : 7,202,539 B2  Page 1 of 1
APPLICATION NO. : 11/132373
DATED : April 10, 2007
INVENTOR(S) : Nabatame et al.

It is certified that error appears in the above-identified patent and that said Letters Patent is hereby corrected as shown below:

Title Page;

On the face of the patent, Under Item (63) please change:

"Renesas Technology Corporation" to

--Renesas Technology Corp.--

Signed and Sealed this

Eighteenth Day of September, 2007

JON W. DUDAS
*Director of the United States Patent and Trademark Office*